United States Patent [19]
Guo et al.

[11] Patent Number: 5,367,482
[45] Date of Patent: * Nov. 22, 1994

[54] HIGH VOLTAGE RANDOM-ACCESS MEMORY CELL INCORPORATION LEVEL SHIFTER

[75] Inventors: Ta-Pen Guo, Cupertino; Adi Srinivasan, Fremont, both of Calif.

[73] Assignee: Aptix Corporation, San Jose, Calif.

[*] Notice: The portion of the term of this patent subsequent to Aug. 24, 2010 has been disclaimed.

[21] Appl. No.: 110,682

[22] Filed: Aug. 23, 1993

Related U.S. Application Data

[63] Continuation of Ser. No. 900,241, Jun. 17, 1992, Pat. No. 5,239,503.

[51] Int. Cl.$^5$ .............................. G11C 11/40
[52] U.S. Cl. .................. 365/156; 365/154; 365/189.11
[58] Field of Search ............. 365/154, 156, 189.11

[56] References Cited

U.S. PATENT DOCUMENTS

| | | | |
|---|---|---|---|
| 4,287,574 | 9/1981 | Uchida | 365/156 |
| 4,403,306 | 9/1983 | Tokushige et al. | 365/156 |
| 4,536,859 | 8/1985 | Kamuro | 365/154 |
| 4,541,073 | 9/1985 | Brice et al. | 365/156 |
| 4,779,226 | 10/1988 | Haraszti | 365/49 |
| 4,816,706 | 3/1989 | Dhong et al. | 307/530 |
| 5,239,503 | 8/1993 | Guo et al. | 365/156 |
| 5,301,147 | 4/1994 | Guo et al. | 365/156 X |
| 5,315,545 | 5/1994 | Guo et al. | 365/156 |

Primary Examiner—Eugene R. La Roche
Assistant Examiner—Do Hyum Yoo
Attorney, Agent, or Firm—D'Alessandro, Frazzini & Ritchie

[57] ABSTRACT

A level-shifting static random access memory cell includes a first stage having a first P-Channel MOS transistor having its source connected to a high voltage supply rail, and its drain connected to the drain of a first N-Channel MOS transistor. The source of the first N-Channel MOS transistor is connected to the drain of a second N-Channel MOS transistor. The source of the second N-channel MOS transistor is connected to a VSS power supply rail. A second stage comprises a second P-Channel MOS transistor having its source connected to the high voltage supply rail $V_{HS}$, and its drain connected to the drain of a third N-Channel MOS transistor. The source of the third N-Channel MOS transistor is connected to the drain of a fourth N-Channel MOS transistor. The source of the fourth N-channel MOS transistor is connected to VSS. The gates of the first and second P-Channel MOS transistors are cross coupled and the gates of the second and fourth N-Channel MOS transistors are cross coupled. The gates of the first and third N-channel MOS transistors are connected together to power supply rail $V_{DD}$, usually 5 volts. The first and second P-channel MOS transistors are formed in an n-well biased at power supply voltage $V_{HS}$. A bit line coupled to the drain of the second N-Channel MOS transistor through a fifth N-Channel MOS transistor, having its gate connected to a word line.

3 Claims, 1 Drawing Sheet

HIGH VOLTAGE RANDOM-ACCESS MEMORY CELL INCORPORATION LEVEL SHIFTER

This is a continuation of co-pending patent application Ser. No. 07/900,241 filed Jun. 17, 1992 which issued as U.S. Pat. No. 5,239,503 on Aug. 24, 1993.

BACKGROUND OF THE INVENTION

1. Field of the Invention

The present invention relates to semiconductor memories and to static memory cells. More particularly, the present invention relates to a static memory cell with a built-in level shifter and which has no static power consumption.

2. The Prior Art

CMOS Static Random access memory (SRAM) cells are known in the art. A typical prior-art SRAM cell is found in a memory product designated 5101 and manufactured by Intel Corporation of Santa Clara, Calif. The SRAM cell in this product includes six transistors, four of which constitute a cross-coupled latch, and two of which constitute gating devices used to couple the latch to two bit lines (data lines) when the memory cell is selected. These two bit lines are typically connected to a differential amplifier which amplifies the difference in voltage levels on the bit lines. The amplified difference is then interpreted as a logical 0 or a logical 1, according to some design convention.

To write a bit into the memory cell, the memory cell is selected and its bit lines are charged to opposite states by a write driver circuit. The six-transistor prior-art SRAM memory cell requires two gating devices (pass transistors) and two bit lines to be reliably read and written.

In certain applications, it is desirable to provide a high-voltage SRAM memory cell. To implement a high voltage SRAM memory cell using prior art techniques involves using a desired signal as an input to a level-shifter circuit which is used to develop a new high-voltage-level signal at its output. The high-voltage potential may be, for example, a programming voltage level ($V_{HS}$), a power-supply voltage level or a charge pump voltage. Prior art circuits for performing this function are characterized by static power consumption.

BRIEF DESCRIPTION OF THE INVENTION

A level-shifting static random access memory cell according to the present invention includes two stages. The first stage comprises a first P-Channel MOS transistor having its source connected to a high-voltage supply rail, and its drain connected to the drain of a first N-Channel MOS transistor. The source of the first N-Channel MOS transistor is connected to the drain of a second N-Channel MOS transistor. The source of the second N-channel MOS transistor is connected to a $V_{SS}$ power supply rail. The second stage comprises a second P-Channel MOS transistor having its source connected to the high-voltage supply rail $V_{HS}$, and its drain connected to the drain of a third N-Channel MOS transistor. The source of the third N-Channel MOS transistor is connected to the drain of a fourth N-Channel MOS transistor. The source of the fourth N-channel MOS transistor is connected to VSS. The gates of the first and second P-Channel MOS transistors are cross coupled and the gates of the second and fourth N-Channel MOS transistors are cross coupled. The gates of the first and third N-channel MOS transistors are connected together to power supply rail $V_{DD}$, usually 5 volts. The first and second P-channel MOS transistors are formed in an n-well biased at power supply voltage $V_{HS}$. A bit line coupled to the drain of the second N-Channel MOS transistor through a fifth N-Channel MOS transistor, having its gate connected to a word line.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Referring first to FIG, 1, a prior-art six-transistor SRAM memory cell of the type employed in memory devices such as the Intel 5101 SRAM is depicted in schematic diagram form. Transistors t1, t2, t3 and t4 constitute a cross-coupled latch. Transistors t5 and t6 are pass transistors used as gating devices to couple the bit lines A and B (data lines) to the latch when the voltage on the row select line (address line) is high (at 5 volts). The output signal at node Q is a logical 1 when n channel transistors t3 is off and p channel transistor t4 is on, and it is a logical zero when these states are reversed.

Figure 1:
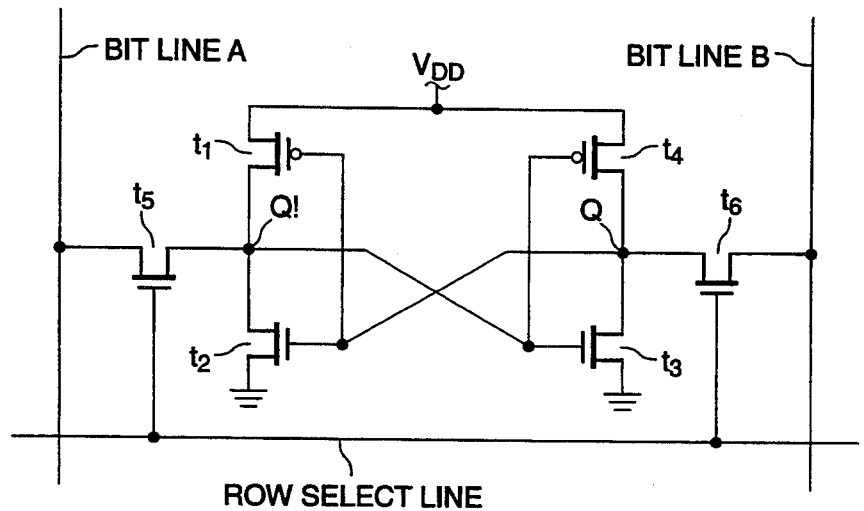
FIG. 1 is a schematic diagram of a typical prior-art static RAM cell.
Figure 2:
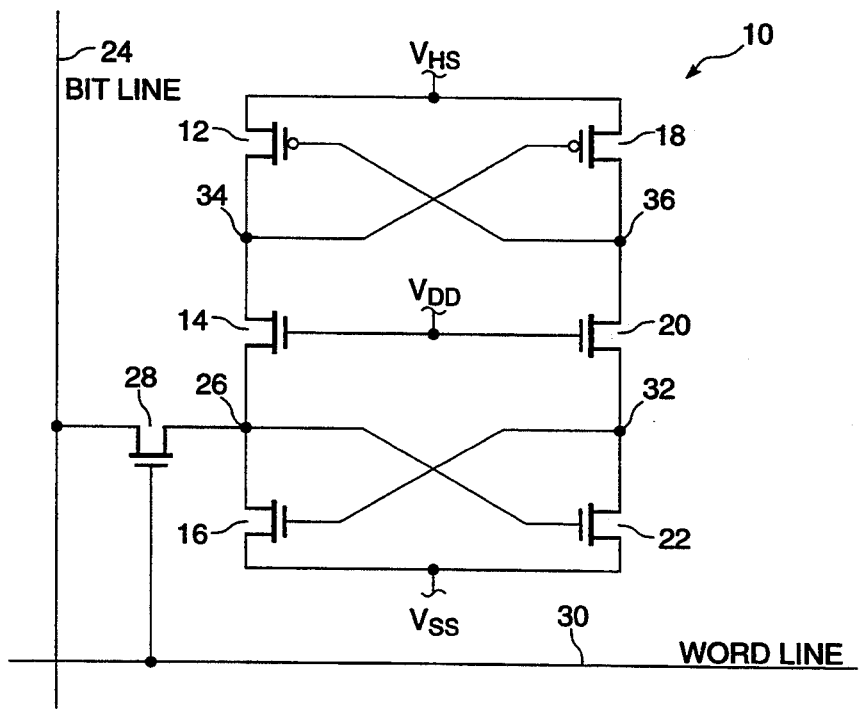
FIG. 2 is a schematic diagram of a static RAM cell with built-in level shifting according to the present invention.

The six-transistor SRAM memory cell of FIG. 1 requires two gating devices (pass transistors) t5 and t6 and two bit lines A and B to be reliably read and written. Reading and writing are accomplished through the left and right bit lines of the memory cell of FIG. 1. For example, to read the data out of the memory cell in FIG. 1, a logic high signal is applied to the row select line, turning on transistors t5 and t6. If a logical 0 is on node Q1 and an logic 1 is on node Q, bit line A is charged to a lower level than bit line B. These two bit lines are typically connected to the inputs of a differential amplifier (not shown) which amplifies the difference in voltage levels on the bit lines. The amplified difference is then interpreted as a logical 0 or a logical 1, according to some design convention.

To write a bit into the memory cell, the row select line is brought high and bit lines A and B are charged to opposite states by a write-driver circuit (not shown), which drives node Q1 to the same logical level as the bit line A and node Q to the same logical level as bit line B through transistors t5 and t6.

To implement a high-voltage SRAM memory cell using the prior art circuit of FIG. 1, the desired signal (Q or Q1) is used as an input to a level-shifter circuit which has a high-voltage output stage to output a new "high-voltage" level, $V_{HS}$ (supply or charge pump voltage). Alternatively process changes would be needed to allow the N-channel transistors t2 and t3 to tolerate the potential difference $V_{ds}=V_{HS}$ with no gate-aided breakdown.

According to the present invention, a static RAM cell 10 with a built-in level shifter is provided. The cross-coupled latch of the memory cell of the present invention includes a first and a second stage with the output of the first stage connected to the input of the second stage, and the output of the second stage connected to the input of the first stage.

Each stage of level-shifting SRAM cell 10 has three transistors. The first stage comprises P-Channel MOS transistor 12 having its source connected to high-voltage supply rail $V_{HS}$, and its drain connected to the drain of N-Channel MOS transistor 14. The high voltage, which, for the purposes of this disclosure will be referred to herein as $V_{HS}$, may be supplied from an external supply or may be internally generated.

The source of N-Channel MOS transistor 14 is connected to the drain of N-Channel MOS transistor 16. The source of N-channel MOS transistor 16 is connected to power supply rail $V_{SS}$ (usually ground). The second stage comprises P-Channel MOS transistor 18 having its source connected to high voltage supply rail $V_{HS}$, having a voltage valve between 8 and 20 volts, and its drain connected to the drain of N-Channel MOS transistor 20. The source of N-Channel MOS transistor 20 is connected to the drain of N-Channel MOS transistor 22. The source of N-Channel MOS transistor 22 is connected to power supply rail $V_{SS}$.

The gates of P-Channel MOS transistors 12 and 18 are cross coupled as are the gates of N-Channel MOS transistors 16 and 22. The gates of N-channel MOS transistors 14 and 20 are connected together to power supply rail $V_{DD}$, usually 5 volts. N-Channel MOS transistors 14 and 20 having their gates connected to $V_{DD}$ are used to protect N-Channel MOS transistors 16 and 22. P-channel MOS transistors 12 and 18 are formed in an n-well, which is biased at power supply voltage $V_{HS}$. A bit line 24 is coupled to the output node 26 of the first stage through N-Channel MOS transistor 28, having its gate connected to word line 30.

If word line 30 and bit line 24 are driven to VCC (5 volts), then the first stage output node 26 and node 34 would be driven to $V_{CC}$-vtn (3.5 volts). This would cause N-Channel MOS transistor 22 to conduct more current and P-Channel MOS transistor 18 to conduct less current. Therefor node 36 would be driven to zero volts and node 34 would be pulled up all the way to $V_{HS}$, since the gate of P-Channel MOS transistor 12 would be pulled to ground with node 36. Because the N-Channel devices 14 and 20 have their gates tied to VCC, there is no snap-back or gate-aided breakdown problem for those devices.

Because the highest drain-source voltage across N-Channel MOS transistors 16 and 22 is 3.5 Volt ($V_{CC}$-vtn), there is no breakdown issue. P-Channel MOS transistors 12 and 18 do not need to be protected since P-channel devices always have much larger high voltage breakdown margins than do similar N-channel devices.

By adding these extra two N-Channel devices 14 and 20, the 5-volt bit line voltage level has been successfully shifted to $V_{HS}$ level. Since N-Channel MOS transistor 16 would be totally off when P-Channel MOS transistor 12 is on, and N-Channel MOS 22 would be totally off when P-Channel MOS transistor 18 is on there is no static power consumption in the SRAM cell.

The level-shifting static RAM cell of the present invention provides several advantages. First, it eliminates the need for a separate level-shifting circuit, thus reducing transistor count and circuit layout area. Conventional SRAM cells can be modified to this circuit without the need to employ process changes.

The high-voltage level-shifted output RAM cell of the present invention is useful for numerous applications. For example, it may be used to drive pass gates to eliminate $V_T$ voltage drops, or for providing a programming voltage for programming other electrical devices.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A level-shifting static random access memory cell which may be coupled to a bit line and a word line operating at a first set of high and low logic-state voltages substantially equal to a first power-supply rail potential and a second power-supply rail potential, respectively, said level-shifting static random access memory cell having at least one output node operating at a second set of high and low logic state voltages substantially equal to a third high-voltage power-supply rail potential and said second power-supply rail potential, respectively, said cell comprising:

a first P-Channel MOS transistor having a source connected to said third high-voltage power-supply rail potential, and further having a drain and a gate;

a first N-Channel MOS transistor having a drain connected to the drain of said first P-Channel MOS transistor, a gate connected to said first power-supply rail potential, and a source;

a second N-Channel MOS transistor having a drain connected to the source of said first N-Channel MOS transistor, a source connected to said second power-supply rail potential, and a gate;

a second P-Channel MOS transistor having a source connected to said third high-voltage power-supply rail potential, and further having a drain connected to the gate of said first P-Channel MOS transistor and a gate connected to to the drain of said first P-Channel MOS transistor;

a third N-Channel MOS transistor having a drain connected to the drain of said second P-Channel MOS transistor, a gate connected to said first power-supply rail potential, and a source connected to the gate of said second N-Channel MOS transistor;

a fourth N-Channel MOS transistor having a drain connected to the source of said third N-Channel MOS transistor, a source connected to said second power-supply rail potential, and a gate connected to the source of said first N-Channel MOS transistor.

2. The level-shifting static random access memory cell of claim 1, further including a fifth N-Channel MOS transistor having a source connected to said bit line, a drain connected to the drain of said second N-Channel MOS transistor and a gate connected to said word line.

3. The level-shifting static random access memory cell of claim 1 wherein said first power-supply rail potential is about 5 volts, said second power-supply rail potential is about zero volts, and said third power-supply rail potential is between 8 and 20 volts.

* * * * *